(12) United States Patent
Tsutsui (10) Patent No.: US 11,012,645 B2
(45) Date of Patent: May 18, 2021

(54) SOLID-STATE IMAGE SENSOR

(71) Applicant: Tower Partners Semicoductor Co., Ltd., Toyama (JP)

(72) Inventor: Masafumi Tsutsui, Toyama (JP)

(73) Assignee: Tower Partners Semicoductor Co., Ltd., Toyama (JP)

( * ) Notice: Subject to any disclaimer, the term of this patent is extended or adjusted under 35 U.S.C. 154(b) by 99 days.

(21) Appl. No.: 16/441,489

(22) Filed: Jun. 14, 2019

(65) Prior Publication Data
US 2019/0297282 A1  Sep. 26, 2019

Related U.S. Application Data

(63) Continuation of application No. PCT/JP2017/042400, filed on Nov. 27, 2017.

(30) Foreign Application Priority Data

Dec. 15, 2016 (JP) .............................. JP2016-243353

(51) Int. Cl.
*H04N 5/355* (2011.01)
*H01L 27/146* (2006.01)
(Continued)

(52) U.S. Cl.
CPC ......... *H04N 5/3559* (2013.01); *H01L 27/146* (2013.01); *H01L 27/1463* (2013.01);
(Continued)

(58) Field of Classification Search
CPC ...... H04N 5/3559; H04N 5/359; H04N 5/374; H04N 5/369; H04N 5/2254; H04N 5/341; H01L 27/146; H01L 27/14603; H01L 27/14612; H01L 27/14623; H01L 27/14643; H01L 27/14601;
(Continued)

(56) References Cited

U.S. PATENT DOCUMENTS 9,484,370 B2 * 11/2016 Leung ............... H01L 27/14609
2009/0024531 A1    1/2009 Yamahata
(Continued)

FOREIGN PATENT DOCUMENTS

JP  2001267553 A    9/2001
JP  2007294531   * 11/2007
(Continued)

*Primary Examiner* — Albert H Cutler
(74) *Attorney, Agent, or Firm* — Knobbe, Martens, Olson & Bear, LLP (57) ABSTRACT

A solid-state image sensor includes pixels, each of which is provided with a light receiving portion, a charge storage portion, a gate electrode, a first trench formed in a region between the light receiving portion and the charge storage portion, a first insulating film provided in the first trench, a transmitting portion, and a light-shielding film covering the charge storage portion, the transmitting portion, and the gate electrode. In a plan view, a distance from an end of the light-shielding film through the transmitting portion to the charge storage portion in a direction from the light receiving portion toward the charge storage portion is longer than a distance from the end of the light-shielding film through the first trench to the charge storage portion.

16 Claims, 10 Drawing Sheets

(51) Int. Cl.
*H04N 5/359* (2011.01)
*H04N 5/374* (2011.01)
*H04N 5/369* (2011.01)
*H04N 5/225* (2006.01)
*H04N 5/341* (2011.01)

(52) U.S. Cl.
CPC ..... *H01L 27/14603* (2013.01); *H04N 5/2254* (2013.01); *H04N 5/341* (2013.01); *H04N 5/359* (2013.01); *H04N 5/369* (2013.01); *H04N 5/374* (2013.01)

(58) Field of Classification Search
CPC ......... H01L 27/14605; H01L 27/14607; H01L 27/14609; H01L 27/14614; H01L 27/1463; H01L 27/14632; H01L 27/14634; H01L 27/14638; H01L 27/14654; H01L 27/14659
See application file for complete search history.

(56) References Cited

U.S. PATENT DOCUMENTS

| | | | |
|---|---|---|---|
| 2009/0256230 | A1 | 10/2009 | Watanabe |
| 2012/0153126 | A1 | 6/2012 | Oike |
| 2012/0249829 | A1* | 10/2012 | Izuha ................ H01L 27/14685 348/229.1 |
| 2013/0341684 | A1* | 12/2013 | Fukuro ............. H01L 27/14689 257/230 |
| 2015/0028189 | A1 | 1/2015 | Hagiwara |

FOREIGN PATENT DOCUMENTS

| | | |
|---|---|---|
| JP | 2007294531 A | 11/2007 |
| JP | 200927237 A | 2/2009 |
| JP | 2009253149 A | 10/2009 |
| JP | 2011233589 A | 11/2011 |
| JP | 2012129798 A | 7/2012 |
| JP | 201523250 A | 2/2015 |

* cited by examiner

SOLID-STATE IMAGE SENSOR

CROSS-REFERENCE TO RELATED APPLICATIONS

This application is a continuation of International Patent Application Number PCT/JP2017/042400 filed on Nov. 27, 2017 which claims priority from Japanese application JP2016-243353 filed on Dec. 15, 2016, the disclosure of which applications are hereby incorporated by reference into this application in their entirety for all purposes.

BACKGROUND

The technique described in this specification relates to a solid-state image sensor.

BACKGROUND ART

In a case in which a MOS-type solid-state image sensor with two-dimensionally arranged pixels employs a rolling shutter, image distortions occur in photographing an object moving at a high speed. In order to eliminate such image distortions, employment of a global shutter is suggested, which starts and ends imaging in all pixels simultaneously.

A global shutter operation requires, in each pixel, a charge storage portion for temporarily storing charges from the end of imaging to the start of reading the charges, in addition to a photoelectric converter for photoelectric conversion. A layout relationship between a photoelectric converter and a charge storage portion is suggested in, for example, Japanese Unexamined Patent Publication No. 2009-272374.

In a solid-state image sensor of a global shutter type including a charge storage portion, it is required for the charge storage portion not to perform photoelectric conversion even when light enters a pixel region while the charge storage portion stores charges. To address the problem, for example, a light-shielding film made of metal, as illustrated in Japanese Unexamined Patent Publication No. 2009-272374, is provided in an upper region of the charge storage portion to block light incident from above.

It is however difficult for a light-shielding film provided in an upper region of the charge storage portion to block light obliquely incident on the charge storage portion. Since light travels straight within a semiconductor substrate, the light-shielding film needs to expand from the upper region of the charge storage portion to an upper region of the photoelectric converter in accordance with the depth of the charge storage portion, and cover a part of the photoelectric converter, in order to block obliquely incident light. Since light is diffracted at the ends of the light-shielding film, even the light perpendicularly incident on the semiconductor substrate has a light component which obliquely travels in the semiconductor substrate. The obliquely traveling light enters the charge storage portion and causes a parasitic signal, which is called optical crosstalk. A reduction in the optical crosstalk is necessary to improve the image quality of a global shutter element. Japanese Unexamined Patent Publication No. 2011-233589 suggests filling a trench with an insulating film to reflect incident light within a semiconductor substrate by utilizing a difference in the refractive indexes between the semiconductor substrate and the insulating film.

SUMMARY

The both of the techniques disclosed in Japanese Unexamined Patent Publication No. 2009-272374 and Japanese Unexamined Patent Publication No. 2011-233589 have difficulties in effectively reducing optical crosstalk.

It is an object of the technique disclosed in this specification to provide a solid-state image sensor capable of significantly reducing optical crosstalk.

A solid-state image sensor disclosed herein includes an image region in which a plurality of pixels are arranged. Each of the pixels includes: a light receiving portion provided in a semiconductor substrate and generating a charge by photoelectric conversion; a charge storage portion provided in the semiconductor substrate and storing the charge generated in the light receiving portion; a gate electrode provided on the charge storage portion and transferring the charge generated in the light receiving portion to the charge storage portion; a first trench formed in a region of the semiconductor substrate between the light receiving portion and the charge storage portion; a first insulating film provided in the first trench; a second trench formed in a region of the semiconductor substrate between the light receiving portions of adjacent ones of the pixels; a second insulating film provided in the second trench; a transmitting portion provided at an end of a boundary between the light receiving portion and the charge storage portion so as to be in contact with the first insulating film, and serving as a transfer path of the charge from the light receiving portion to the charge storage portion; and a light-shielding film covering the charge storage portion, the transmitting portion, and the gate electrode. In a plan view, a distance from an end of the light-shielding film through the transmitting portion to the charge storage portion in a direction from the light receiving portion toward the charge storage portion is longer than a distance from the end of the light-shielding film through the first trench to the charge storage portion.

According to the solid-state image sensor disclosed in this specification, optical crosstalk can be significantly reduced.

DETAILED DESCRIPTION

An embodiment of the present disclosure will now be described in detail with reference to the drawings.

Embodiment

Figure 1:
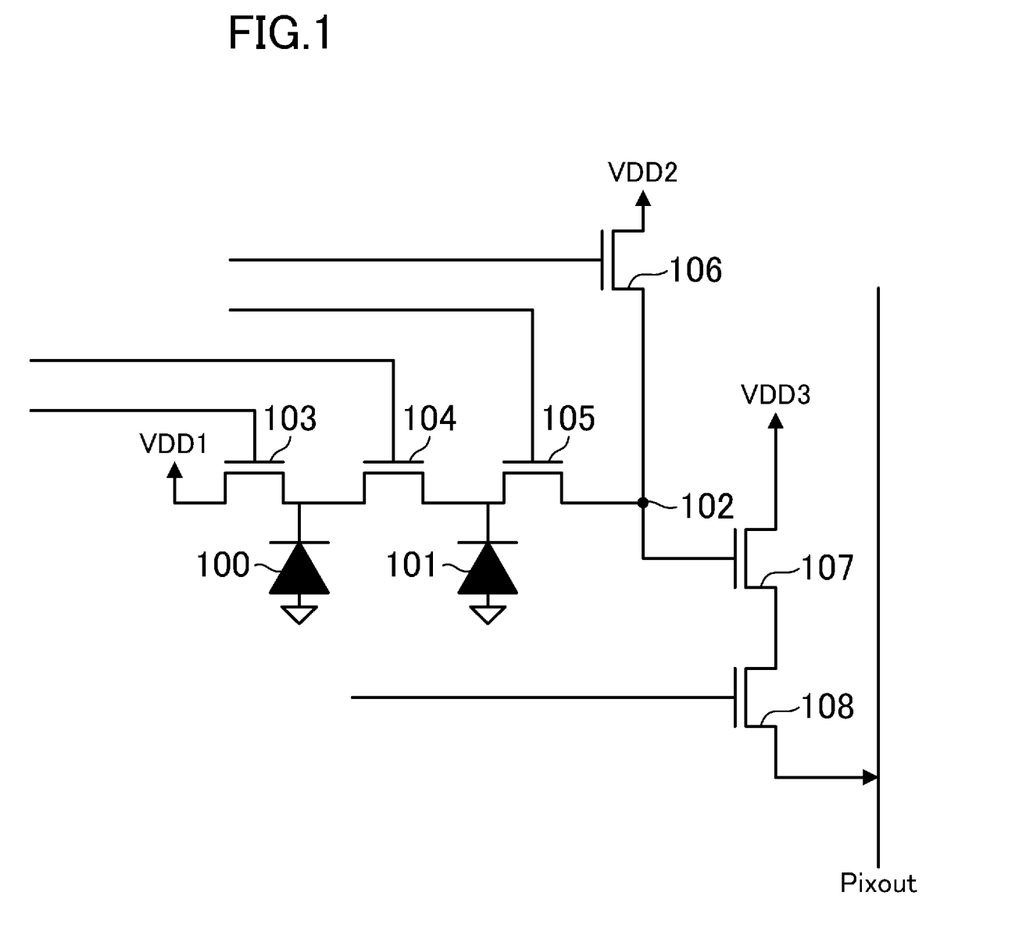
FIG. 1 is a circuit diagram illustrating a configuration of a pixel circuit of a solid-state image sensor according to an embodiment of the present disclosure.
Figure 2:
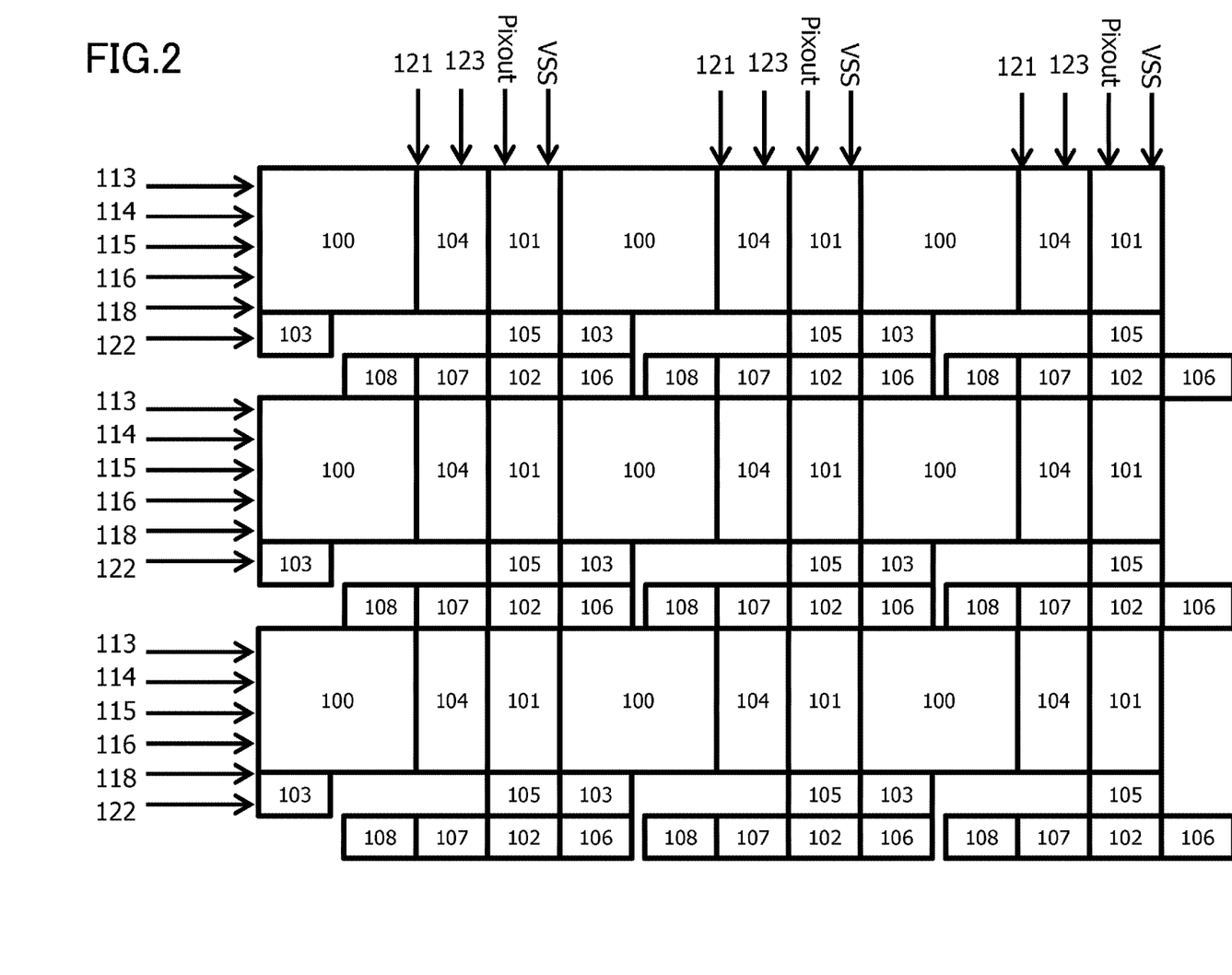
FIG. 2 is a plan view schematically illustrating the solid-state image sensor according to the embodiment.
Figure 3:
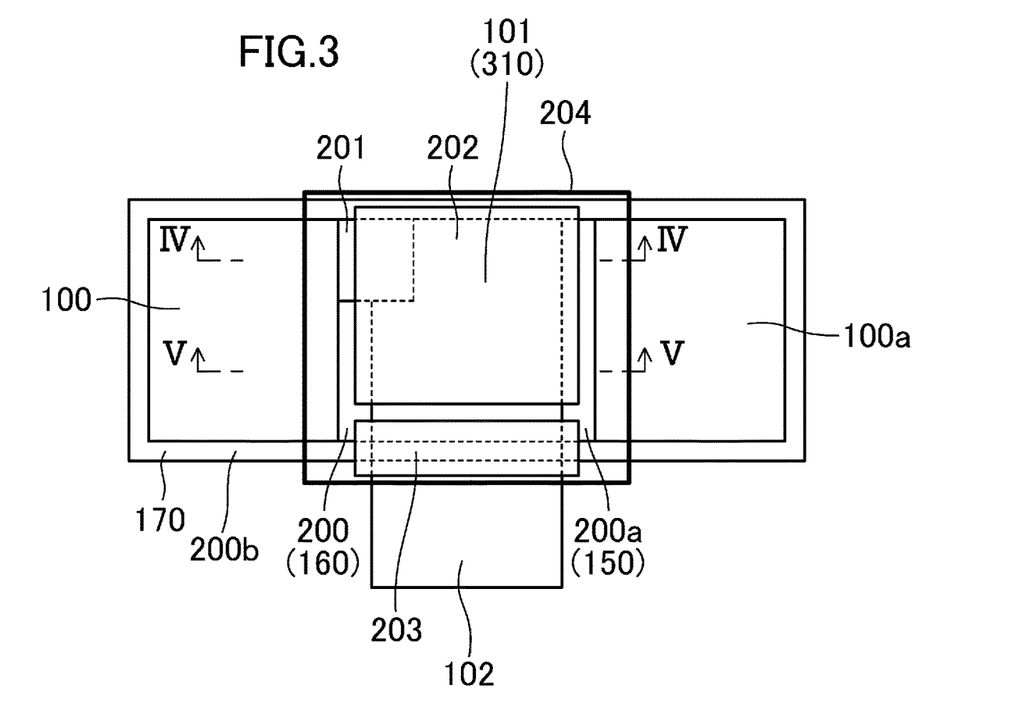
FIG. 3 is a plan view illustrating a configuration of each pixel in the solid-state image sensor according to the embodiment.
Figure 4:
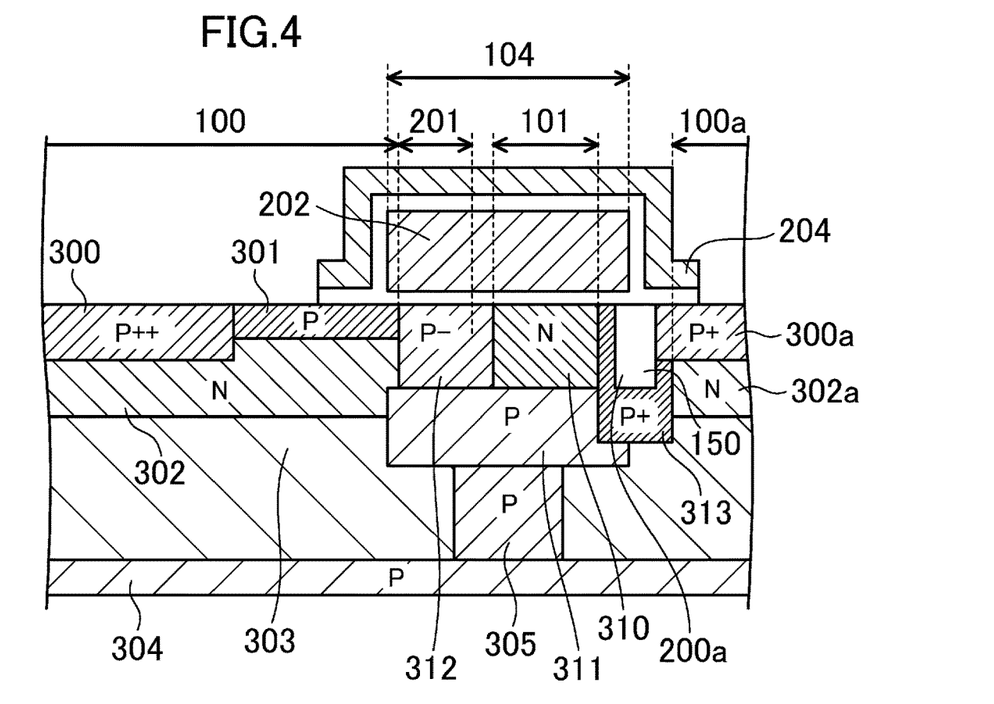
FIG. 4 is a cross-sectional view taken along line IV-IV of the solid-state image sensor shown in FIG. 3.
Figure 5:
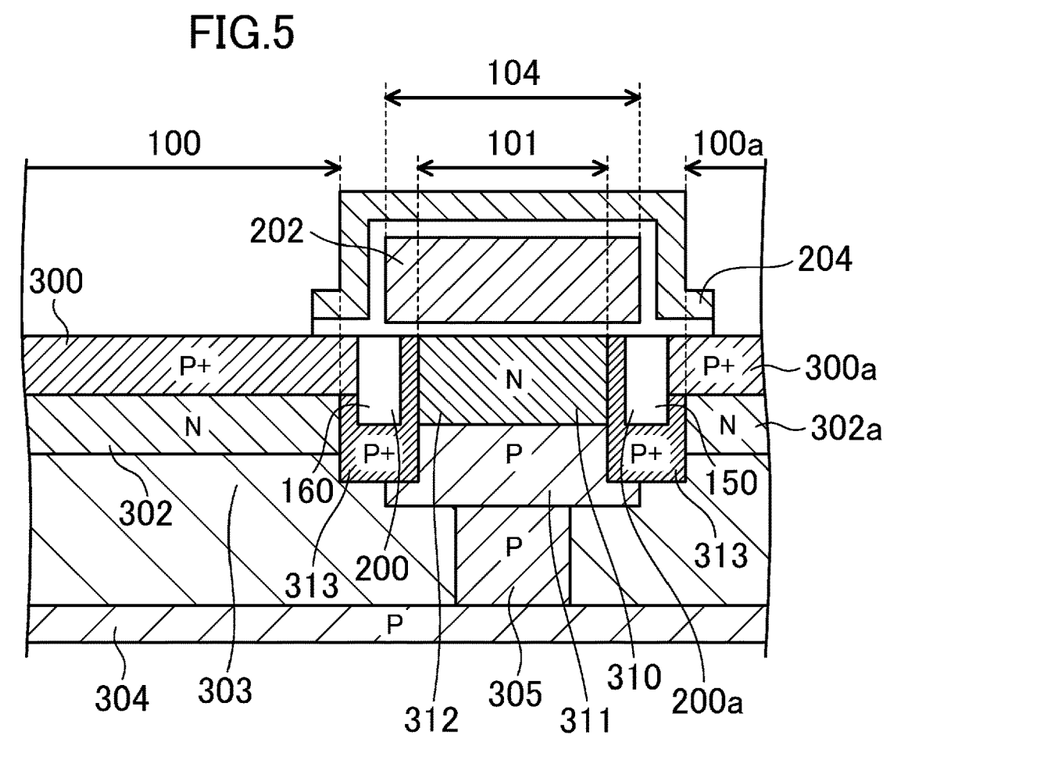
FIG. 5 is a cross-sectional view taken along line V-V of the solid-state image sensor shown in FIG. 3.

FIG. 1 is a circuit diagram illustrating a configuration of a pixel circuit of a solid-state image sensor according to an embodiment of the present disclosure. FIG. 2 is a plan view schematically illustrating the solid-state image sensor according to the embodiment. FIG. 3 is a plan view illustrating a configuration of each pixel in the solid-state image sensor according to the embodiment. FIG. 4 is a cross-sectional view taken along line IV-IV of the solid-state image sensor shown in FIG. 3. FIG. 5 is a cross-sectional view taken along line V-V of the solid-state image sensor shown in FIG. 3. FIG. 3 also illustrates members provided under a light-shielding film 204 for easier understanding of the configuration.

The solid-state image sensor of the present embodiment includes an image region (not shown) in which a plurality of pixels are arranged, for example, in a matrix. As shown in FIG. 1, each pixel is provided with a light receiving portion 100, a charge storage portion 101, a first charge transfer transistor 104, and a second charge transfer transistor 105. The light receiving portion 100 generates charges by photoelectric conversion. The charge storage portion 101 stores the charges generated in the light receiving portion 100. The first charge transfer transistor 104 controls transfer of the charges generated in the light receiving portion 100 to the charge storage portion 101. The second charge transfer transistor 105 controls transfer of the charges stored in the charge storage portion 101. Each pixel is provided with a global reset transistor 103, a source follower transistor 107, a reset transistor 106, and an output row selection transistor 108. The global reset transistor 103 includes one end (i.e., a drain) connected to a first power supply VDD1, and the other end (i.e., a source) connected to the light receiving portion 100 and the first charge transfer transistor 104. The source follower transistor 107 includes a gate electrode connected to the second charge transfer transistor 105 via a charge voltage converter 102. The reset transistor 106 includes one end connected to a second power supply VDD2, and the other end connected to the second charge transfer transistor 105 via the charge voltage converter 102. The output row selection transistor 108 is connected to the source of the source follower transistor 107. The drain of the source follower transistor 107 is connected to a third power supply VDD3.

As shown in FIG. 2, the plurality of pixels are arranged in a matrix. The gate electrodes of the plurality of global reset transistors 103 provided in the pixels in the same row may be connected in common to one of signal lines 113. The operations of the first charge transfer transistors 104 are controlled by a corresponding one of signal lines 114. The operations of the second charge transfer transistors 105 are controlled by a corresponding one of signal lines 115. The operations of the reset transistors 106 are controlled by a corresponding one of signal lines 116. The operations of the output row selection transistors 108 are controlled by a corresponding one of signal lines 118.

As shown in FIGS. 3 and 4, the light receiving portion 100 may be an embedded photodiode which includes, for example, p-type layers (first and second p-type surface layers 300 and 301) and an n-type layer 302 and which stores electrons in the n-type layer 302. However, the configuration is not limited thereto as long as the light receiving portion 100 has a function of storing electrons or holes generated by photoelectric conversion. As long as the charge storage portion 101 is capable of storing charges, the charge storage portion 101 may be comprised of an n-type layer 310 (a floating diffusion layer) containing n-type impurities of, for example, about $1 \times 10^{20}/cm^3$.

The conductivity types of the global reset transistor 103, the reset transistor 106, the first charge transfer transistor 104, and the second charge transfer transistor 105 may be n- or p-channel types.

In a case in which the global reset transistor 103 is of an n-channel type, the first power supply VDD1 has a voltage of, for example, about 3.3 V. When a high voltage is applied to the gate electrode, the global reset transistor 103 becomes conductive, and the light receiving portion 100 is reset. The voltage of the first power supply VDD1 may be any voltage as long as it is higher than the electrostatic potential of the light receiving portion 100 at depletion.

The global reset transistor 103 may be configured to exhibit an anti-blooming function of preventing or reducing overflow of the signal charges from the light receiving portion 100 to the charge storage portion 101 by applying, at photoelectric conversion, a low voltage to the gate electrode of the global reset transistor 103 in order to control the electrostatic potential between the first power supply VDD1 and the gate electrode, and thereby sweep out the signal charges, which have been excessively generated in the light receiving portion 100, to the first power supply VDD1. However, in a case of using an n-type semiconductor substrate, the global reset transistor 103 may not necessarily exhibit the anti-blooming function. In such a case, the p-type impurity concentration is controlled so that the electrostatic potential between the light receiving portion 100 and the n-type semiconductor substrate be 0 V, thereby allowing a vertical overflow drain to exhibit the anti-blooming function.

If the signal charges are electrons, an electrostatic potential of about −0.3 V is generated between the light receiving portion 100 and the charge storage portion 101, while the first charge transfer transistor 104 is off, to prevent or reduce transfer of the electrons. In transferring charges from the light receiving portion 100, a high voltage is applied to a gate electrode 202 of the first charge transfer transistor 104 so that the electrostatic potential between the light receiving portion 100 and the charge storage portion 101 be higher than a maximum electrostatic potential at depletion of the light receiving portion 100.

As shown in FIG. 2, signal lines Pixout, each of which is provided for one of columns, extend vertically, and the signal lines 115 extend horizontally. The signal lines 113 and 114 may be arranged parallel to the signal lines Pixout. The directions, in which the other signal lines and power supply interconnects extend, are changeable as appropriate depending on the layout. Note that the signal lines 113, 114, 116, and 118 for controlling the charge voltage converters 102, the reset transistors 106, the source follower transistors 107, the output row selection transistors 108, and other transistors, and power supply interconnects 121, 122, and 123 corresponding to the first, second, and third power supplies VDD1, VDD2, and VDD3, respectively, may be shared by the plurality of pixels. The output row selection transistors 108 are not required if the power supply interconnects 121, 122 and 123 are independent from each other.

Now, the operation of the solid-state image sensor will be described. First, high voltages are applied to the gate electrodes of the global reset transistors 103 to sweep out all the charges generated in the light receiving portions 100. Then, the photoelectric conversion starts. After a certain exposure time has passed, the second charge transfer transistors 105 and the reset transistors 106 in all the pixels become conductive to sweep out all the charges of the charge storage portions 101. After that, the second charge transfer transistors 105 are placed into a non-conductive state and high voltages are applied to the gate electrodes of the first charge transfer transistors 104 to transfer the signal charges from the light receiving portions 100 to the charge storage portions 101. Here, the global reset transistors 103 sweep out the charges and the first charge transfer transistors 104 transfer the charges simultaneously in all the pixels. Accordingly, the global shutter operation is achieved, which starts and ends imaging in all pixels simultaneously.

Next, the voltages of the charge voltage converters 102 are reset to the voltage of the second power supply by the reset transistors 106 in a certain row. After that, signals are transferred from the charge storage portions 101 via the second charge transfer transistors 105 in the selected row to the charge voltage converters 102. Then, the output row selection transistors 108 in the selected row read out outputs of only the source follower transistors 107 in the corresponding row to the corresponding signal line Pixout. While changing rows, the above-described procedures, that is, from the reset of the charge voltage converters 102 to the read-out of the output signals, are performed to read out outputs of all the pixels arranged two-dimensionally. An example has been described where the global reset transistors 103 perform global reset operations. However, the charges can be swept out from the light receiving portions 100 without the global reset transistors 103, by providing vertical overflow drains and applying high voltages to the gate electrodes 202 of the first charge transfer transistors 104 of all the pixels before the photoelectric conversion. In this case, the above-described operation may be performed after the exposure time.

Now, a more specific configuration of the solid-state image sensor according to the present embodiment will be described.

As shown in FIGS. 3 to 5, a semiconductor substrate includes a p-type layer 304 provided on an n-type substrate region (not shown) and electrically isolating the substrate region from the light receiving portion 100, and an n-type layer 303 and a p-type layer 305 provided on the p-type layer 304.

The light receiving portion 100 provided in the semiconductor substrate includes the n-type layer 303, an n-type layer 302 on the n-type layer 303, and the first and second p-type surface layers 300 and 301 on the n-type layer 302. The planar shape of the light receiving portion 100 is not particularly limited. FIG. 3 illustrates an example where the light receiving portion 100 has a quadrilateral planar shape.

The charge storage portion 101 (i.e., the n-type layer 310) is electrically isolated from the light receiving portion 100 by a p-type layer (a first p-type impurity region) 311 provided under the n-type layer 310 and a p-type layer provided between the light receiving portion 100 and the charge storage portion 101. The first p-type surface layer 300 has a p-type impurity concentration ranging from about $1\times10^{18}$ to about $1\times10^{20}/cm^3$. The second p-type surface layer 301 has a lower p-type impurity concentration than the first p-type surface layer 300, that is, from about $1\times10^{16}$ to about $1\times10^{18}/cm^3$. The n-type layer 302 has an n-type impurity concentration ranging from about $1\times10^{16}$ to about $1\times10^{18}/cm^3$. The n-type layer 303 has an n-type impurity concentration ranging from about $1\times10^{14}$ to about $1\times10^{17}/cm^3$. The p-type layer 304 has a p-type impurity concentration ranging from about $1\times10^{16}$ to about $1\times10^{18}/cm^3$. The p-type layer 305 has a p-type impurity concentration ranging from about $1\times10^{16}$ to about $1\times10^{18}/cm^3$. The n-type layer 310 has an n-type impurity concentration ranging from about $1\times10^{16}$ to about $1\times10^{18}/cm^3$. A p-type layer 311 has a p-type impurity concentration ranging from about $1\times10^{16}$ to about $1\times10^{18}/cm^3$. A p-type layer (a second p-type impurity region) 312 has a lower impurity concentration than the p-type layers 301 and 311, that is, from about $1\times10^{16}$ to about $1\times10^{18}/cm^3$.

The solid-state image sensor according to this embodiment is provided with a first trench 200 and a second trench 200a. The first trench 200 is formed in a region of the semiconductor substrate between the light receiving portion 100 and the charge storage portion 101 (i.e., the n-type layer 310). The second trench 200a is formed in a region of the semiconductor substrate between the light receiving portion 100 and a light receiving portion 100a of adjacent pixels. The first trench 200 and the second trench 200a are filled with a first insulating film 160 and a second insulating film 150, respectively, which are made of a material, such as silicon oxide, with a refractive index lower than a refractive index of the semiconductor substrate. As long as the light receiving portion 100 is electrically isolated from the charge storage portion 101 and from the adjacent light receiving portion 100a, metal layers or other layers may be formed in the first and second insulating films 160 and 150.

The first and second trenches 200 and 200a may have depths ranging, for example, from about 50 nm to about 300 nm, and widths ranging from about 100 nm to about 300 nm. The first and second trenches 200 and 200a may have substantially the same depths as the depth of the n-type layer 310.

A third trench 200b, which surrounds the peripheries of the light receiving portions 100 and 100a and the charge storage portion 101, and a third insulating film 170, which is formed in the third trench 200b, may also be formed. Forming, in the third trench 200b, the insulating film with a lower refractive index than the refractive index of the semiconductor substrate allows for reflection of oblique light at the boundary between the semiconductor substrate and the insulating film, and increases light incident on the light receiving portion 100. This configuration can further reduce the oblique light incident on the charge storage portion 101.

A transmitting portion 201 is provided at an end of the boundary between the light receiving portion 100 and the charge storage portion 101. The transmitting portion 201 is in contact with the first insulating film 160, and serves as a transfer path of the charges from the light receiving portion 100 to the charge storage portion 101. In a case in which the light receiving portion 100 has a quadrilateral planar shape, the transmitting portion 201 is provided at a corner of the light receiving portion 100 facing the charge storage portion 101. Since the transmitting portion 201 is a region without the first trench 200, the charge storage portion 101 in that region is less shielded from the oblique light than the charge storage portion 101 in a region with the first trench 200. The intensity of the incident light decreases with an increasing distance from the center of the light receiving portion 100. Thus, the placement of the transmitting portion 201 at the above-described position contributes to reducing the amount of the photoelectric conversion in the transmitting portion 201, and hence reducing the parasitic signal, which can reduce the influence on the image quality. Placing the transmitting portion 201, not protected by the first insulating film 16 which reflects the incident light, away from the center of the light receiving portion 100 also contributes to reducing a decrease in the amount of incident light.

The transmitting portion 201 may be provided opposite to the side of the charge storage portion 101 in contact with the charge voltage converter 102 (i.e., may be provided at a position away from the charge voltage converter 102) as viewed from the center of the charge storage portion 101 in plan view. In this configuration, the portion of the n-type layer 310 which is adjacent to the transmitting portion 201 has a smaller width than the portion of the n-type layer 310 which is adjacent to the first trench 200. Thus, the charge transfer is less inhibited even at a low electrostatic potential at depletion, because a portion with a lower electrostatic potential is connected to the second charge transfer transistor 105 via a portion with a higher electrostatic potential.

The gate electrode 202 of the first charge transfer transistor 104 is provided on the charge storage portion 101, with a gate insulating film interposed therebetween. A light-shielding film 204, which covers the transmitting portion and the gate electrode 202, is provided on the gate electrode 202. The light-shielding film 204 may be made, for example, of metal such as tungsten. A gate electrode 203 of the second charge transfer transistor 105 is provided on a region between the charge storage portion 101 and the charge voltage converter 102, with a gate insulating film interposed therebetween.

In the example shown in FIG. 3, the light-shielding film 204 has a quadrilateral planar shape. However, the shape is not limited thereto. The light-shielding film 204 may cover at least the entire upper portion of the charge storage portion 101 and the entire upper portion of the transmitting portion 201. The light-shielding film 204 prevents or reduces photoelectric conversion in the charge storage portion 101.

In the solid-state image sensor of the present embodiment, the following relation applies in plan view: the distance from the end of the light-shielding film 204 through the transmitting portion 201 to the charge storage portion 101 in the direction from the light receiving portion 100 toward the charge storage portion 101 (from the left toward the right in FIG. 3) is longer than the distance from the end of the light-shielding film 204 through the first trench 200 to the charge storage portion 101. In this configuration, the light diffracted and traveling around the end of the light-shielding film 204 is less likely to enter the charge storage portion 101, which contributes to reducing optical crosstalk. The increased distance between the n-type layer 302 and the charge storage portion 101 allows the light receiving portion 100 and the charge storage portion 101 to be electrically isolated from each other by an electrostatic potential, for example, lower than −0.3 V even in a case in which the p-type layer 312 has a lower p-type impurity concentration. The p-type layer 312 of the transmitting portion 201 has a width ranging from about 200 nm to about 400 nm in one preferred embodiment. Increasing, as much as possible, the width of the portion of the charge storage portion 101 which is adjacent to the first trench 200 allows the charge storage portion 101 to store a larger amount of charges.

Note that the charge storage portion 101 having a small planar area stores a small amount of charges. Thus, the distance from the end of the light-shielding film 204 through the first trench 200 to the charge storage portion 101 may be set to an appropriate value, as will be described later, in one preferred embodiment.

The portion of the charge storage portion 101 (i.e., the n-type layer 310) which is in contact with the transmitting portion 201 may have a higher n-type impurity concentration than the other portion of the charge storage portion 101. In the example shown in FIG. 3, the corner of the charge storage portion 101 which is in contact with the transmitting portion 201 is recessed. Thus, if the charge storage portion 101 has a uniform n-type impurity concentration, the amount of charges that can be stored in the portion of the charge storage portion 101 which is in contact with the transmitting portion 201 is reduced due to the small width. Increasing the n-type impurity concentration in the portion of the charge storage portion 101 which is in contact with the transmitting portion 201 contributes to increasing the amount of charges that can be stored in the charge storage portion 101 within a range that allows the portion to have a lower electrostatic potential than the n-type layer 310, which is adjacent to the first trench 200, at the depletion.

As shown in FIGS. 4 and 5, a p-type layer 313 may surround the first trench 200 and the second trench 200a. The p-type layer 313 contains p-type impurities ranging, for example, from about $1 \times 10^{18}$ to about $1 \times 10^{19}/cm^3$. The p-type layer 313 reduces a dark current generated at the boundary between the first insulating film 160 and the semiconductor substrate in the first trench 200, and at the boundary between the second insulating film 150 and the semiconductor substrate in the second trench 200a.

In the transmitting portion 201, the p-type layer 312 may have a lower p-type impurity concentration than the p-type layers 301 and 311. This configuration allows a depletion region formed by the p-type layer 312 and the n-type layer 302 to extend toward the charge storage portion 101, and allows the charges generated by oblique light incident on the p-type layer 312 to move easily to the light receiving portion 100. As a result, the movement of the charges to the charge storage portion 101 can be prevented, and the electronic crosstalk caused by the movement of the charges can be reduced. In addition, the lower p-type impurity concentration of the p-type layer 312 allows the first charge transfer transistor 104 to transfer charges easily from the light receiving portion 100 to the charge storage portion 101.

In this embodiment, the gate electrode 202 of the first charge transfer transistor 104 covers the upper portion of the charge storage portion 101. However, the gate electrode 202 may be provided in the semiconductor substrate between the light receiving portion 100 and the charge storage portion 101 and above the p-type layer 312. In such a case, a gate electrode, to which another voltage is applied, may or may not be provided in an upper portion of the charge storage portion 101.

A p-type layer containing p-type impurities of about $1\times10^{16}$ to about $1\times10^{18}/cm^3$ may be provided between the n-type layer 310 of the charge storage portion 101 and the gate insulation film under the gate electrode 202. This configuration reduces a dark current from the gate insulating film.

Figure 6A:
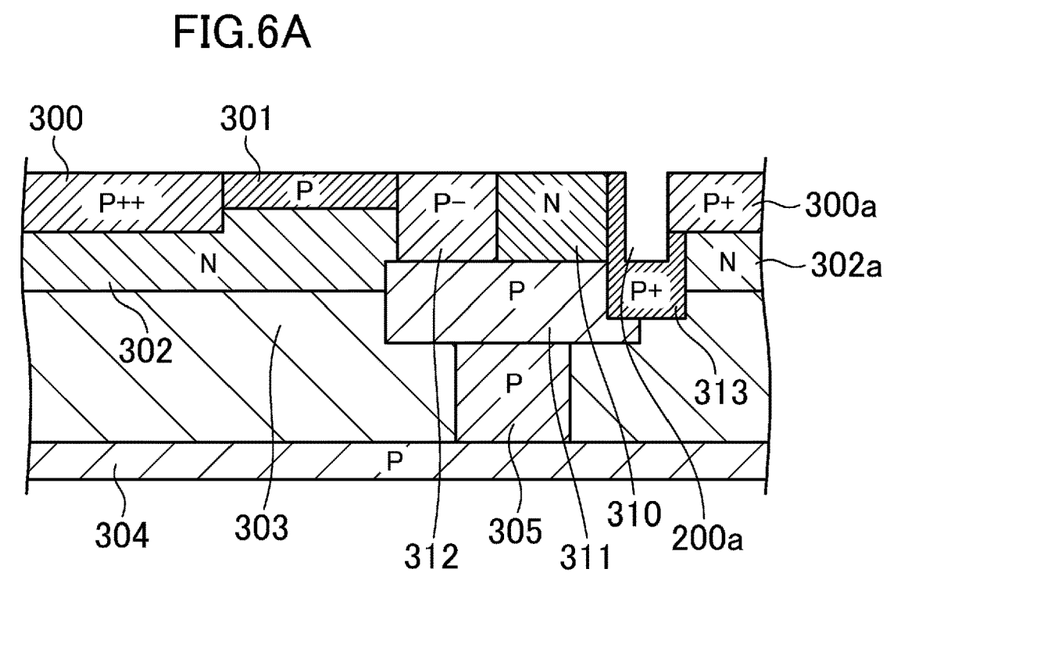
FIG. 6A is a cross-sectional view illustrating a method of manufacturing the solid-state image sensor according to the embodiment.
Figure 6B:
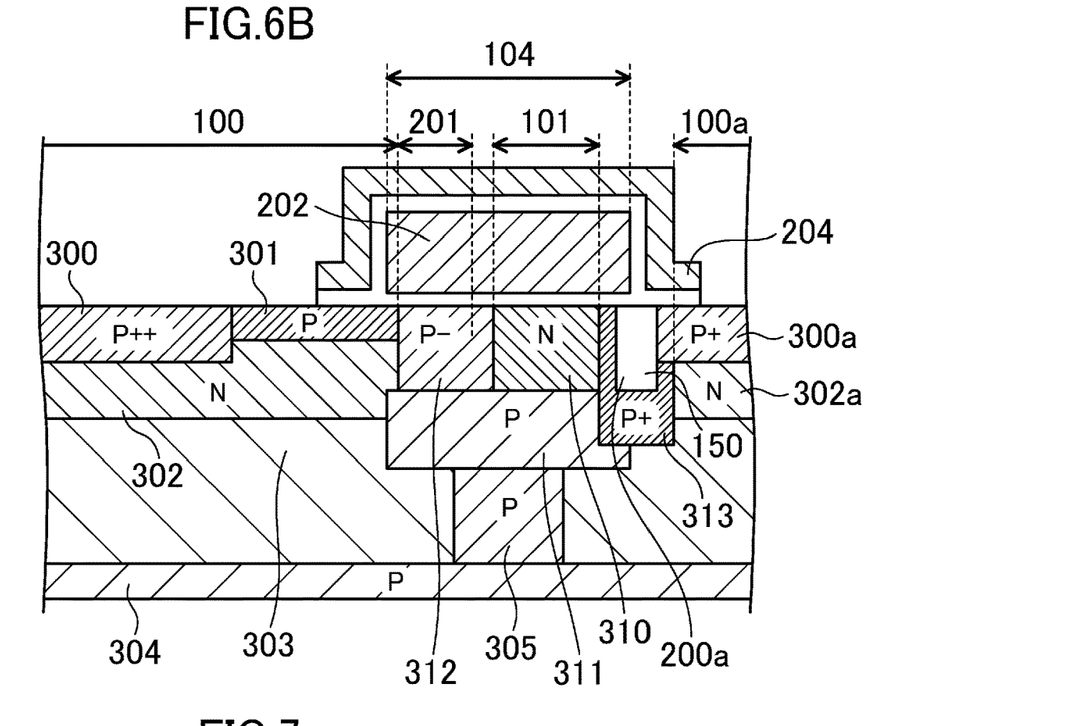
FIG. 6B is a cross-sectional view illustrating the method of manufacturing the solid-state image sensor according to the embodiment.

FIGS. 6A and 6B are cross-sectional views illustrating a method of manufacturing the solid-state image sensor according to the present embodiment.

As shown in FIG. 6A, a semiconductor substrate, such as silicon containing n-type impurities, is prepared to manufacture a solid-state image sensor. Next, a known ion implantation method is employed to form the p-type layers 304, 305, and 311 in the semiconductor substrate. The portion of the p-type layer 304 where the p-type layer 305 is not formed serves as the n-type layer 303. Then, n-type impurity ions and p-type impurity ions are implanted as appropriate into the semiconductor substrate to form the first and second p-type surface layers 300 and 302, the p-type layers 312, 300a, and 313, and the n-type layers 302, 310, and 302a. As a result, the light receiving portion 100 and the charge storage portion 101 are formed. Next, the first, second, and third trenches 200, 200a, and 200b are formed and thereafter filled with the first, second, and third insulating films 160, 150, and 170, respectively. Note that the first, second, and third trenches 200, 200a, and 200b may be formed before the p- and n-type layers are formed.

Next, as shown in FIG. 6B, after forming the gate insulating film on the semiconductor substrate, the gate electrodes 202 and 203 made, for example, of polysilicon are formed on the gate insulating film by a known method. Subsequently, the light-shielding film 204 made of metal such as tungsten and covering the transmitting portion 201 and the charge storage portion 101 is formed on the gate electrode 202 by a known method such as sputtering. The solid-state image sensor according to the present embodiment can be obtained in this manner.

Figure 7:
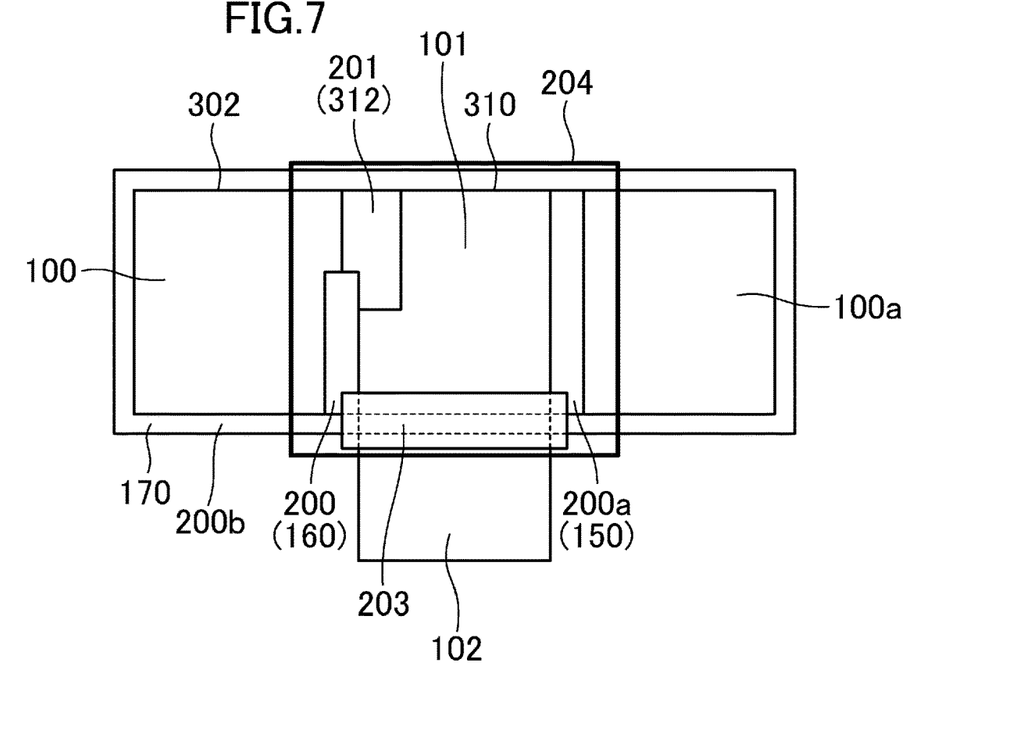
FIG. 7 is a plan view illustrating a solid-state image sensor according to a first variation of the embodiment.

FIG. 7 is a plan view illustrating a solid-state image sensor according to a first variation of the present embodiment. In FIG. 7, the gate electrode 202 is not shown. As shown in FIG. 7, the portion of the light receiving portion 100 which is in contact with the transmitting portion 201 may protrude beyond the other portion facing the charge storage portion 101.

This configuration contributes to expanding the light receiving portion 100 to a region where the first trench 200 is not provided, and thus allows the light diffracted and traveling around the end of the light-shielding film 204 to enter the light receiving portion 100 easily. The parasitic signal may decrease accordingly, as will be described later. An afterimage may also decrease effectively.

Figure 8:
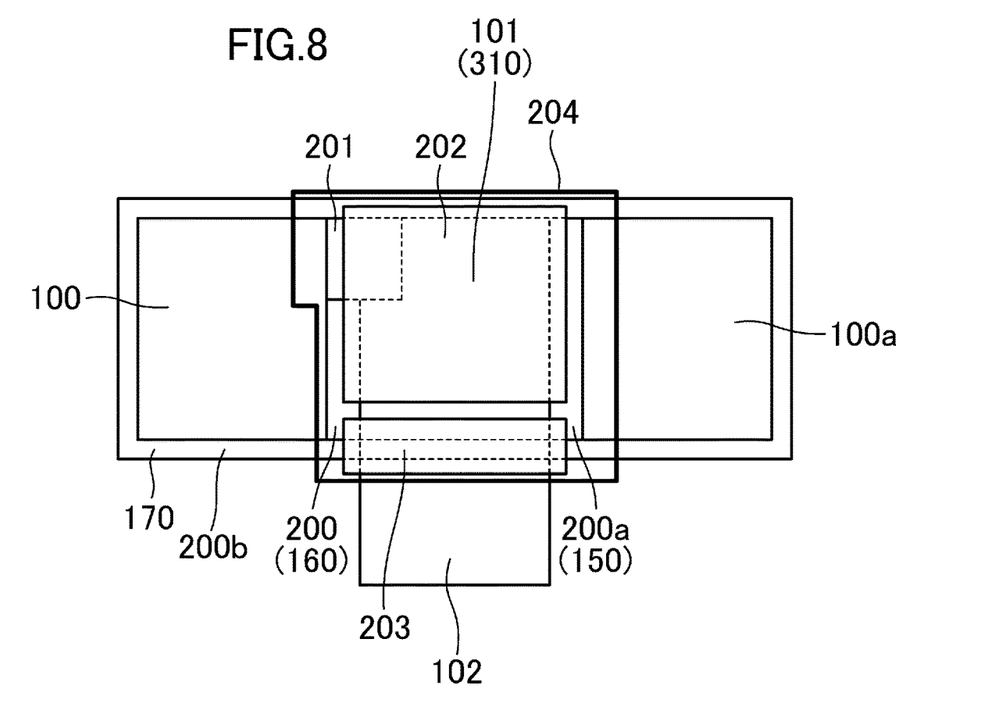
FIG. 8 is a plan view illustrating a solid-state image sensor according to a second variation of the embodiment.

FIG. 8 is a plan view illustrating a solid-state image sensor according to a second variation of the present embodiment. As shown in FIG. 8, the portion of the light-shielding film 204 which is provided in an upper portion of the transmitting portion 201 may protrude toward the light receiving portion 100 as compared with the portion provided above the first trench 200.

Oblique light and diffracted light are easily incident on the transmitting portion 201 without the first trench 200. However, in this variation, the protrusion of the light-shielding film 204 does not block light incident on the light receiving portion 100, while effectively reducing light incident on the transmitting portion 201. Thus, in the solid-state image sensor according to the present variation, optical crosstalk can be reduced without degrading the sensitivity.

Figure 9:
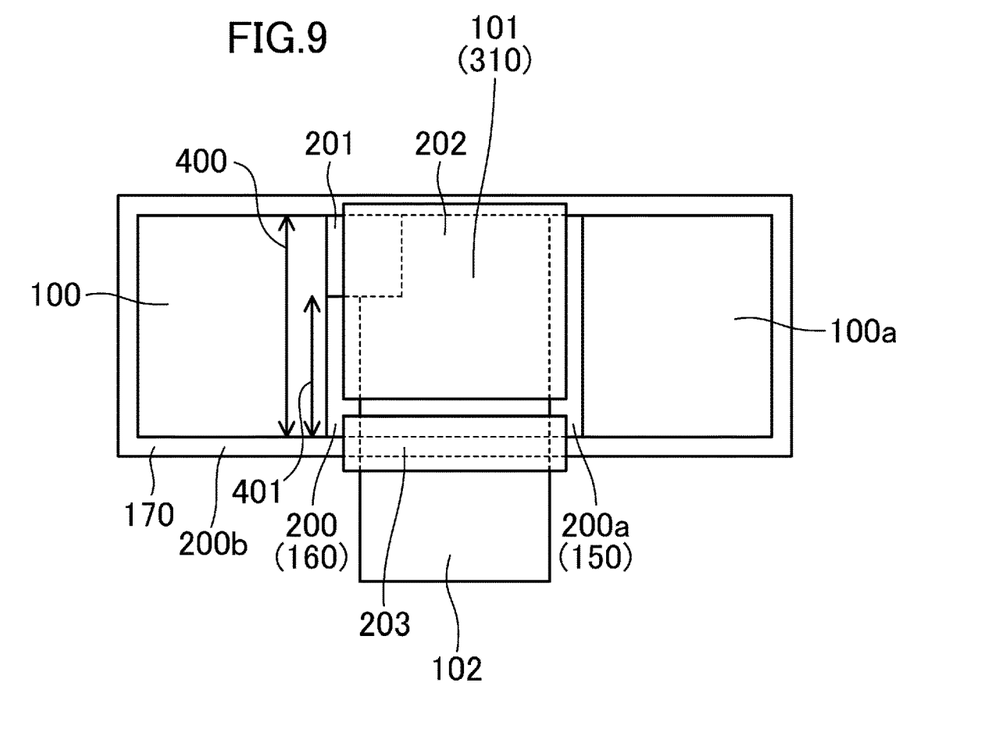
FIG. 9 is a plan view illustrating a solid-state image sensor for use to measure effects.
Figure 10A:
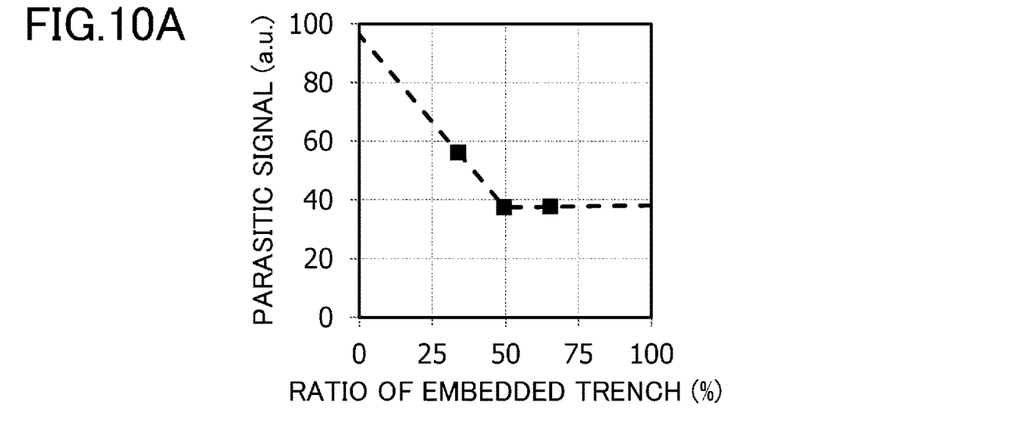
FIG. 10A shows a relationship between a ratio of an embedded trench and a parasitic signal.
Figure 10B:
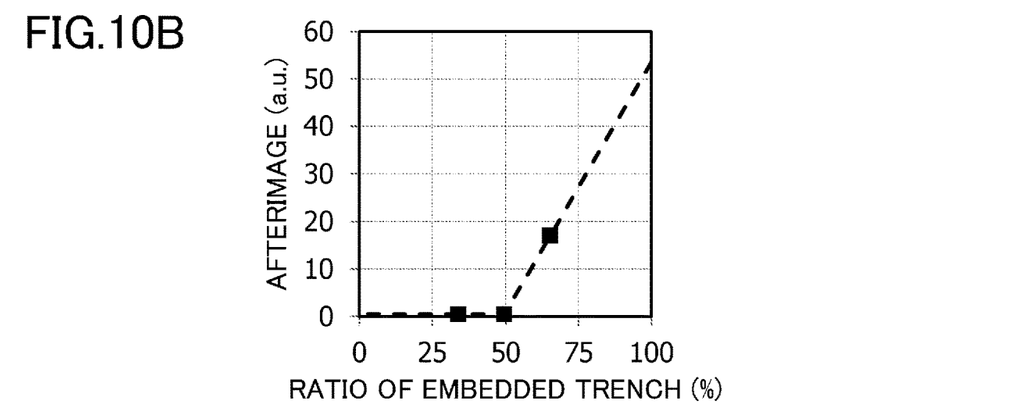
FIG. 10B shows a relationship between the ratio of the embedded trench and an afterimage.
Figure 10C:
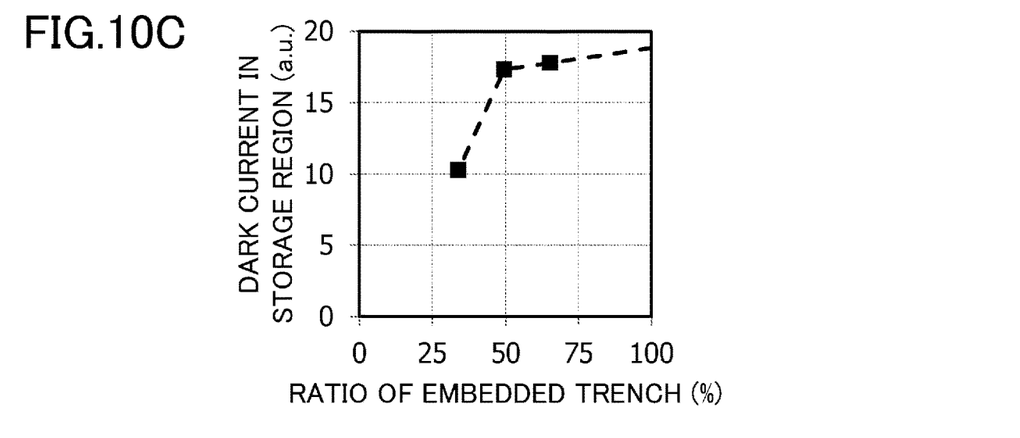
FIG. 10C shows a relationship between the ratio of the embedded trench and a dark current in a storage region.

FIG. 9 is a plan view illustrating a solid-state image sensor for use to measure effects. FIGS. 10A, 10B, and 10C respectively show a relationship between a ratio of an embedded trench and a parasitic signal, a relationship between the ratio of the embedded trench and an afterimage, and a relationship between the ratio of the embedded trench and a dark current in a storage region. In this example, the ratio of the embedded trench is assumed to be a value obtained by (the length of the first trench 200)/(the length of the light receiving portion 100 in the direction in which the first trench extends).

The inventor of the present application prepared a plurality of solid-state image sensors including the first trenches 200 with various lengths so as to measure, for example, parasitic signals and afterimages. A parasitic signal was measured in the following manner. First, a high voltage was applied to the gate electrode of the global reset transistor 103, and the light receiving portion 100 was irradiated with light while maintaining a state with no charge, which had been generated by photoelectric conversion, stored in the light receiving portion 100. While the first charge transfer transistor 104 was off, the second charge transfer transistor 105 outputted the charges stored in the charge storage portion 101 to the signal line 116. From this output signal, a signal obtained through the same operation without light irradiation was subtracted to measure a parasitic signal to be photoelectrically converted in the charge storage portion 101.

An afterimage was measured in the following manner. First, the light receiving portion 100 was irradiated with such light by which a certain amount of photoelectrically converted charges was stored in the light receiving portion 100. A signal was read out to a signal line by a usual procedure. Then, a signal was read out again to the signal line by the usual procedure without light irradiation. The amount of signal detected at that time was referred to as the afterimage.

FIG. 10A shows the results, according to which it was found that the parasitic signal decreased in a region where the ratio of the embedded trench is less than 50%, and that it was possible to decrease the parasitic signal by about 65% in a region where the ratio of the embedded trench is 50% or higher.

However, an afterimage was generated in the region where the ratio of the embedded trench exceeds 50%, and the greater the ratio of the embedded trench became, the more afterimages occurred. It was also found that a dark current in the storage region (i.e., the charge storage portion 101) was generated in a region where the ratio of the embedded trench exceeds 30%, and that the dark current gently increased in the region where the ratio of the embedded trench exceeds 50%.

The above results show that it is possible to maintain the afterimage and dark current at a low level, while reducing the parasitic signal, by setting an optimum ratio of the embedded trench maintains. In the example of the solid-state image sensor shown in FIG. 9, the optimum ratio of the embedded trench is considered to be about 50%.

Figure 11:
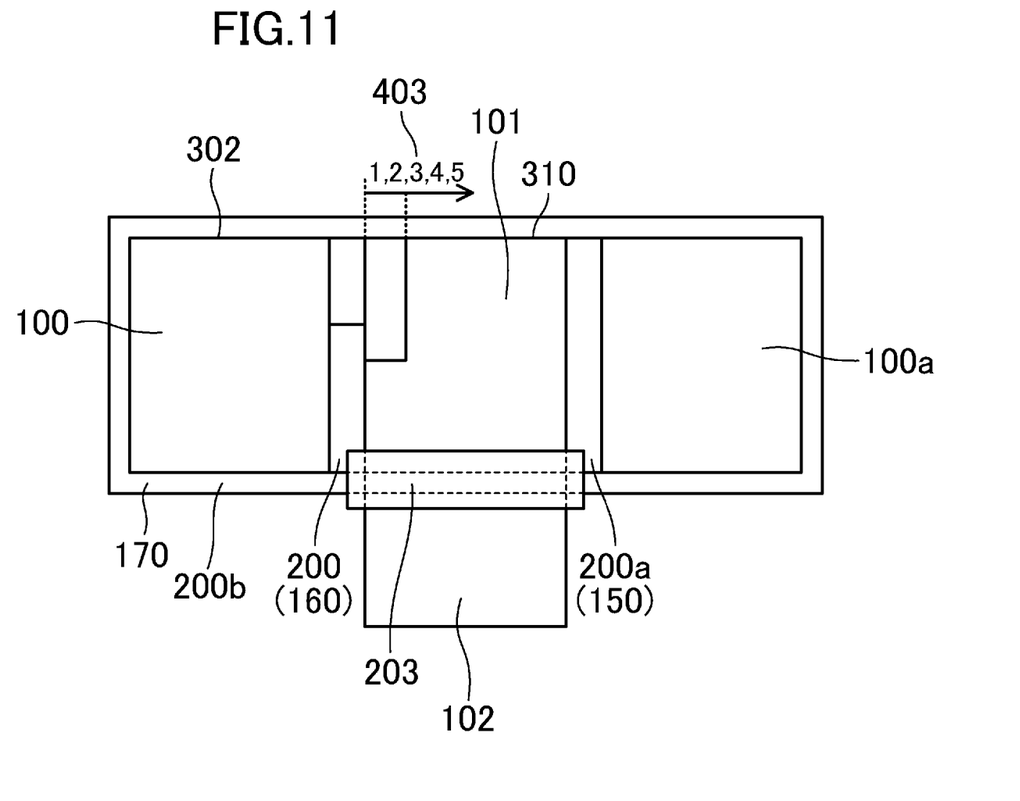
FIG. 11 is a plan view illustrating a solid-state image sensor for use to measure effects.
Figure 12:
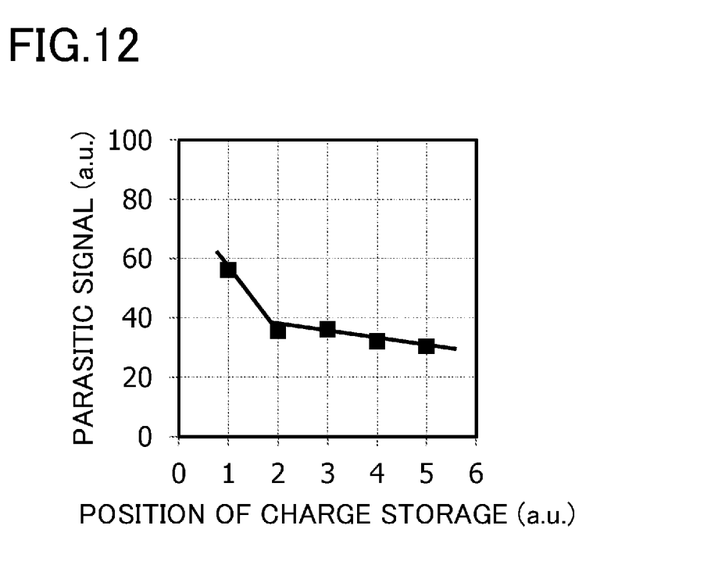
FIG. 12 shows a relationship between the position of a charge storage portion 101 and the magnitude of a parasitic signal.

FIG. 11 is a plan view illustrating a solid-state image sensor for use to measure effects. FIG. 12 shows a relationship between the position of the charge storage portion 101 and the magnitude of a parasitic signal. FIG. 12 shows results of measuring the parasitic signals generated in cases in which an end 403 of the charge storage portion 101 is located at different positions 1 to 5 as shown in FIG. 11.

From the results shown in FIG. 12, it was found that it was possible to reduce the generation of the parasitic signal by increasing the distance between the end 403 of the charge storage portion 101 and the end of the light-shielding film 204.

Figure 13:
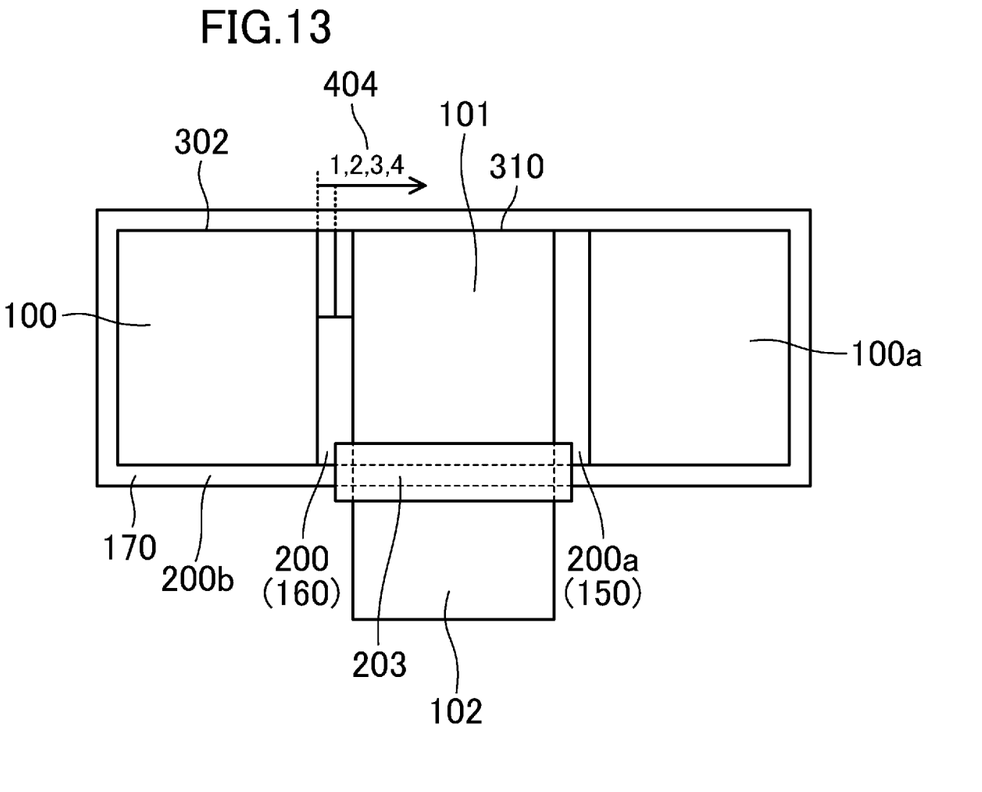
FIG. 13 is a plan view illustrating a solid-state image sensor for use to measure effects.
Figure 14A:
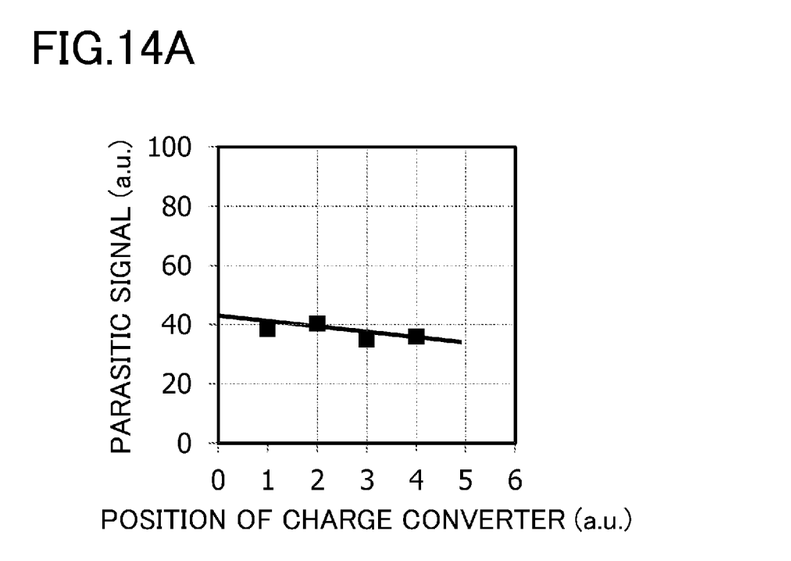
FIG. 14A shows a relationship between a position 404 of a protrusion of a light receiving portion 100 and a parasitic signal.
Figure 14B:
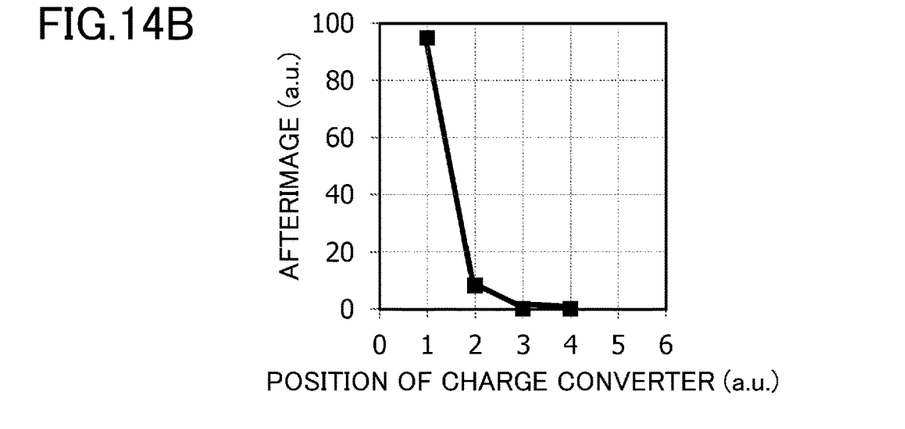
FIG. 14B shows a relationship between the position 404 of the protrusion of the light receiving portion 100 and an afterimage.

FIG. 13 is a plan view illustrating a solid-state image sensor for use to measure effects. FIG. 14A shows a relationship between a position 404 of a protrusion of the light receiving portion (the charge converter in the FIG. 100 and a parasitic signal. FIG. 14B shows a relationship between the position 404 of the protrusion of the light receiving portion 100 and an afterimage. Specifically, the protrusion of the light receiving portion 100 means a protrusion of the n-type layer 302 toward the transmitting portion 201.

From the results shown in FIGS. 14A and 14B, it was found that it was possible to reduce the parasitic signal, and the afterimage as well, by bringing the protrusion of the light receiving portion 100 (i.e., the n-type layer 302) close to the charge storage portion 101.

Figure 15A:
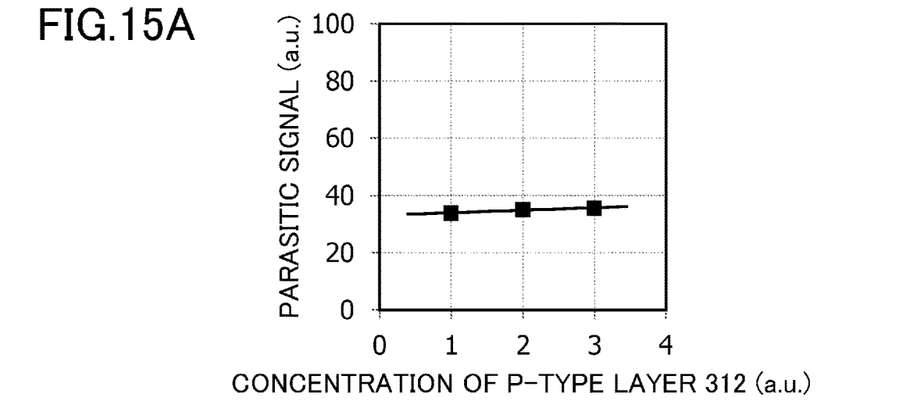
FIG. 15A shows a change in a parasitic signal in the solid-state image sensor in a situation in which a p-type impurity concentration of a p-type layer 312 of a transmitting portion 201 is changed.
Figure 15B:
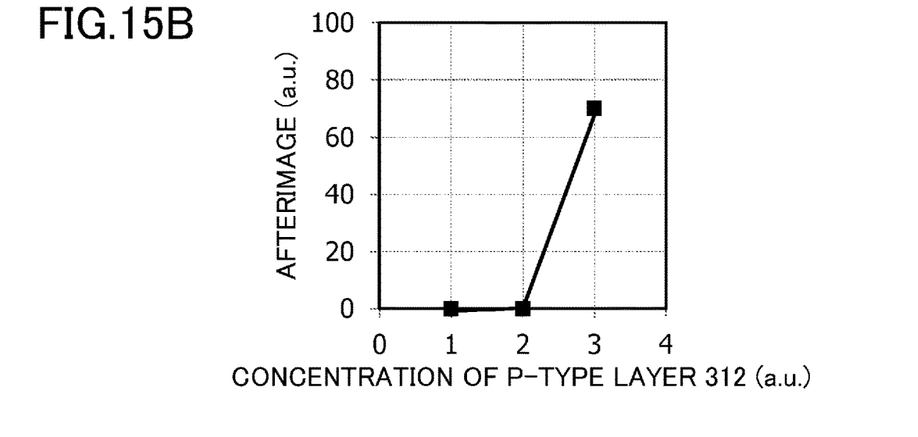
FIG. 15B shows a change in an afterimage in the solid-state image sensor in a situation in which the p-type impurity concentration of the p-type layer 312 of the transmitting portion 201 is changed.

FIG. 15A shows a change in the parasitic signal in the solid-state image sensor in a situation in which a p-type impurity concentration of a p-type layer 312 of a transmitting portion 201 is changed. FIG. 15B shows a change in the afterimage in the solid-state image sensor in a situation in which the p-type impurity concentration of the p-type layer 312 of the transmitting portion 201 is changed.

From the results shown in FIG. 15A, it was confirmed that the parasitic signal gradually increased with an increase in the impurity concentration of the p-type layer 312. On the other hand, from the results shown in FIG. 15B, it was confirmed that an impurity concentration of the p-type layer 312 equal to or higher than a predetermined value caused an afterimage. From these results, it may be said that a lower p-type impurity concentration of the p-type layer 312 is preferable.

From the results described above, according to the solid-state image sensor of the present embodiment and its variations, it is possible to transfer charges from the light receiving portion 100 to the charge storage portion 101, while blocking light incident on the charge storage portion 101 by the light-shielding film 204, the first insulating film 160, and the second insulating film 150. This means that the solid-state image sensor of the present embodiment and its variations are capable of providing excellent image quality while taking advantage of the global shutter type image sensor.

The embodiment and its variations described above are mere preferred examples in nature, and not intended to limit the scope, applications, or use of the invention.

What is claimed is:

1. A solid-state image sensor comprising an image region in which a plurality pixels are arranged, wherein
each of the pixels includes:
a light receiving portion provided in a semiconductor substrate and generating a charge by photoelectric conversion;
a charge storage portion provided in the semiconductor substrate and storing the charge generated in the light receiving portion;
a gate electrode provided on the charge storage portion and transferring the charge generated in the light receiving portion to the charge storage portion;
a first trench formed in a region of the semiconductor substrate between the light receiving portion and the charge storage portion;
a first insulating film provided in the first trench;
a second trench formed in a region of the semiconductor substrate between the light receiving portions of adjacent ones of the pixels;
a second insulating film provided in the second trench;
a transmitting portion provided at an end of a boundary between the light receiving portion and the charge storage portion so as to be in contact with the first insulating film, and serving as a transfer path of the charge from the light receiving portion to the charge storage portion; and
a light-shielding film covering the charge storage portion, the transmitting portion, and the gate electrode, and
in a plan view, a distance from an end of the light-shielding film through the transmitting portion to the charge storage portion in a direction from the light receiving portion toward the charge storage portion is longer than a distance from the end of the light-shielding film through the first trench to the charge storage portion.

2. The solid-state image sensor of claim 1, wherein
a portion of the light receiving portion, which is in contact with the transmitting portion, protrudes beyond another portion facing the charge storage portion.

3. The solid-state image sensor of claim 2, wherein
a portion of the light-shielding film which is provided in an upper portion of the transmitting portion protrudes toward the light receiving portion as compared to a portion provided above the first trench.

4. The solid-state image sensor of claim 3, wherein
a portion of the charge storage portion which is in contact with the transmitting portion has a higher n-type impurity concentration than the other portion of the charge storage portion.

5. The solid-state image sensor of claim 3, wherein
the first and second insulating films have a lower refractive index than the semiconductor substrate.

6. The solid-state image sensor of claim 3, wherein
the charge storage portion is an n-type impurity region formed on a first p-type impurity region, and
the transmitting portion is a second p-type impurity region having a lower p-type impurity concentration than the first p-type impurity region.

7. The solid-state image sensor of claim 2, wherein
a portion of the charge storage portion which is in contact with the transmitting portion has a higher n-type impurity concentration than the other portion of the charge storage portion.

8. The solid-state image sensor of claim 2, wherein
the first and second insulating films have a lower refractive index than the semiconductor substrate.

9. The solid-state image sensor of claim 2, wherein
the charge storage portion is an n-type impurity region formed on a first p-type impurity region, and
the transmitting portion is a second p-type impurity region having a lower p-type impurity concentration than the first p-type impurity region.

10. The solid-state image sensor of claim 1, wherein
a portion of the light-shielding film which is provided in an upper portion of the transmitting portion protrudes toward the light receiving portion as compared to a portion provided above the first trench.

11. The solid-state image sensor of claim 10, wherein
a portion of the charge storage portion which is in contact with the transmitting portion has a higher n-type impurity concentration than the other portion of the charge storage portion.

12. The solid-state image sensor of claim 10, wherein the first and second insulating films have a lower refractive index than the semiconductor substrate.

13. The solid-state image sensor of claim 10, wherein the charge storage portion is an n-type impurity region formed on a first p-type impurity region, and
the transmitting portion is a second p-type impurity region having a lower p-type impurity concentration than the first p-type impurity region.

14. The solid-state image sensor of claim 1, wherein a portion of the charge storage portion which is in contact with the transmitting portion has a higher n-type impurity concentration than the other portion of the charge storage portion.

15. The solid-state image sensor of claim 1, wherein the first and second insulating films have a lower refractive index than the semiconductor substrate.

16. The solid-state image sensor of claim 1, wherein the charge storage portion is an n-type impurity region formed on a first p-type impurity region, and
the transmitting portion is a second p-type impurity region having a lower p-type impurity concentration than the first p-type impurity region.

* * * * *

UNITED STATES PATENT AND TRADEMARK OFFICE
CERTIFICATE OF CORRECTION

| | | |
|---|---|---|
| PATENT NO. | : 11,012,645 B2 | Page 1 of 1 |
| APPLICATION NO. | : 16/441489 | |
| DATED | : May 18, 2021 | |
| INVENTOR(S) | : Masafumi Tsutsui | |

It is certified that error appears in the above-identified patent and that said Letters Patent is hereby corrected as shown below:

On the Title Page

Column 1, Item (71), Line 1, under Applicant, delete "Semicoductor" and insert --Semiconductor--.

In the Specification

In Column 1, Lines 30-31, delete "Japanese. . . . . . .272374." and insert the same in Column 1, Line 29 as continuation of the same paragraph.

In Column 7, Lines 32-33, delete "in plan" and insert --in a plan--.

In Column 7, Line 60, delete "in plan" and insert --in a plan--.

In Column 11, Line 11, delete "FIG." and insert --FIG.)--.

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*